United States Patent
Chang et al.

(10) Patent No.: US 7,035,603 B2
(45) Date of Patent: Apr. 25, 2006

(54) WIRELESS TRANSMITTER

(75) Inventors: Jinn-Ja Chang, Hsinchu (TW); Dung-Yun Chen, Hsinchu (TW)

(73) Assignee: Terax Communication Technologies, Inc., Hsinchu (TW)

( * ) Notice: Subject to any disclaimer, the term of this patent is extended or adjusted under 35 U.S.C. 154(b) by 434 days.

(21) Appl. No.: 10/372,855

(22) Filed: Feb. 26, 2003

(65) Prior Publication Data

US 2004/0166816 A1   Aug. 26, 2004

(51) Int. Cl.
*H01Q 11/12*   (2006.01)
*H04B 1/04*    (2006.01)

(52) U.S. Cl. ..................... 455/118; 455/119

(58) Field of Classification Search .......... 455/76, 455/550.1, 91, 118, 95, 110, 113, 119; 375/295

See application file for complete search history.

(56) References Cited

U.S. PATENT DOCUMENTS

| | | | | |
|---|---|---|---|---|
| 5,022,054 A | * | 6/1991 | Wang | 375/305 |
| 5,425,055 A | * | 6/1995 | Blaker | 375/279 |
| 6,005,894 A | * | 12/1999 | Kumar | 375/270 |
| 6,025,758 A | * | 2/2000 | Lu | 332/100 |
| 6,430,232 B1 | * | 8/2002 | Patire | 375/302 |

* cited by examiner

*Primary Examiner*—Nguyen T. Vo
(74) *Attorney, Agent, or Firm*—Rosenberg, Klein & Lee

(57) ABSTRACT

A wireless transmitter is proposed. First, a ROM having a lookup table therein is provided. The lookup table is used to store a plurality of IF modulation signals so that a state machine can select a corresponding IF modulation signal from the lookup table of the ROM according to loaded data and output a digital IF modulation signal to a DAC, which then converts the digital IF modulation signal into an analog IF modulation signal to be filtered by a low pass filter. Finally, a local oscillator is utilized to modulate the filtered analog IF modulation signal to an emission frequency, hence obtaining an RF signal. The transmitter makes use of a time-sharing way to use a local oscillator together with the receiver. Complexity of device can thus be simplified to meet the requirement of compactness of wireless products.

6 Claims, 3 Drawing Sheets

WIRELESS TRANSMITTER

FIELD OF THE INVENTION

The present invention relates to a wireless communications technique and, more particularly, to a wireless transmitter and a signal modulation and transmission method thereof applicable to wireless transceivers.

BACKGROUND OF THE INVENTION

Along with continual progress of the semiconductor fabrication process, popularity of the Internet, emergence of information appliances, and usage of wireless communications and broadband networks, the life information age comes into being. Transmission of information becomes faster and more diversified. In order to meet the requirements for information of people, the wireless communications technology has become the star attentively looked at by everybody. The requirement for wireless products has also increased relatively.

For a common wireless communications product, its transceiver mainly comprises a receiver and a transmitter. The present invention aims to innovate the transmitter. As shown in FIG. 1, a conventional transmitter comprises a shift register 10, wherein data is shifted therein according to a shift signal after data is loaded, and a 3-bit data signal is outputted to an address generator 12. After the address generator 12 generates a valid address according to index of a sample index counter 14, a corresponding sine baseband modulation signal is acquired from a lookup table in a read-only memory (ROM) 16. The sine baseband modulation signal is then stored in a locker 18. The address generator 12 uses the same way to acquire a corresponding cosine baseband modulation signal, which is then stored in a locker 20.

When both the sine baseband modulation signal and the cosine baseband modulation signal are obtained, the two locker 18 and 20 simultaneously trigger signals to make use of digital-to-analog converters (DACs) 22 and 24 to convert the sine baseband modulation signal and the cosine baseband modulation signal into a sine analog modulation signal. (Q signal) and a cosine analog modulation signal (I signal), respectively. The Q signal is transmitted to a low-pass filter 26 for filtering, and the I signal is transmitted to another low-pass filter 28 for filtering. Next, a frequency synthesizer 30 is used to modulate the two signals to an emission frequency to become a radio-frequency (RF) signal for emission.

The lookup table in the ROM 16 stores baseband modulation signals. In addition to the receiver's frequency synthesizer, the transmitter requires another frequency synthesizer 30 of the emission frequency to modulate the baseband signals to the emission frequency. Because the transmitter requires another frequency synthesizer 30, the structural complexity is raised, the volume cannot be shrunk, and the difficulty in manufacturing is also increased.

Accordingly, the present invention aims to propose a wireless transmitter to effectively resolve the problems in the prior art.

SUMMARY OF THE INVENTION

The primary object of the present invention is to provide a wireless transmitter, wherein the transmitter makes use of a time-sharing way to use a local oscillator together with a receiver. Complexity of device can thus be simplified to meet the requirement of compactness of wireless products.

Another object of the present invention is to provide a low-cost wireless transmitter and a signal modulation and transmission method thereof.

To achieve the above objects, the wireless transmitter of the present invention comprises a ROM having a lookup table therein. The lookup table is used to store a plurality of IF modulation signals so that a state machine can select a corresponding IF modulation signal from the lookup table of the ROM according to a loaded data, temporarily lock and store a sampling value of the IF signal, and then output a digital IF modulation signal to a DAC, which then converts the digital IF modulation signal into an analog IF modulation signal to be filtered by a low pass filter. Finally, a local oscillator is utilized to modulate the filtered analog IF modulation signal to an emission frequency, hence obtaining an RF signal.

The various objects and advantages of the present invention will be more readily understood from the following detailed description when read in conjunction with the appended drawing, in which:

DETAILED DESCRIPTION OF THE PREFERRED EMBODIMENTS

In the present invention, a lookup table in a ROM stores intermediate frequency (IF) modulation signals so that a transmitter can make use of a time-sharing multiplexing way to commonly use a local oscillator with a receiver. Complexity of device can thus be simplified to meet the requirement of compactness of wireless products.

Figure 1:
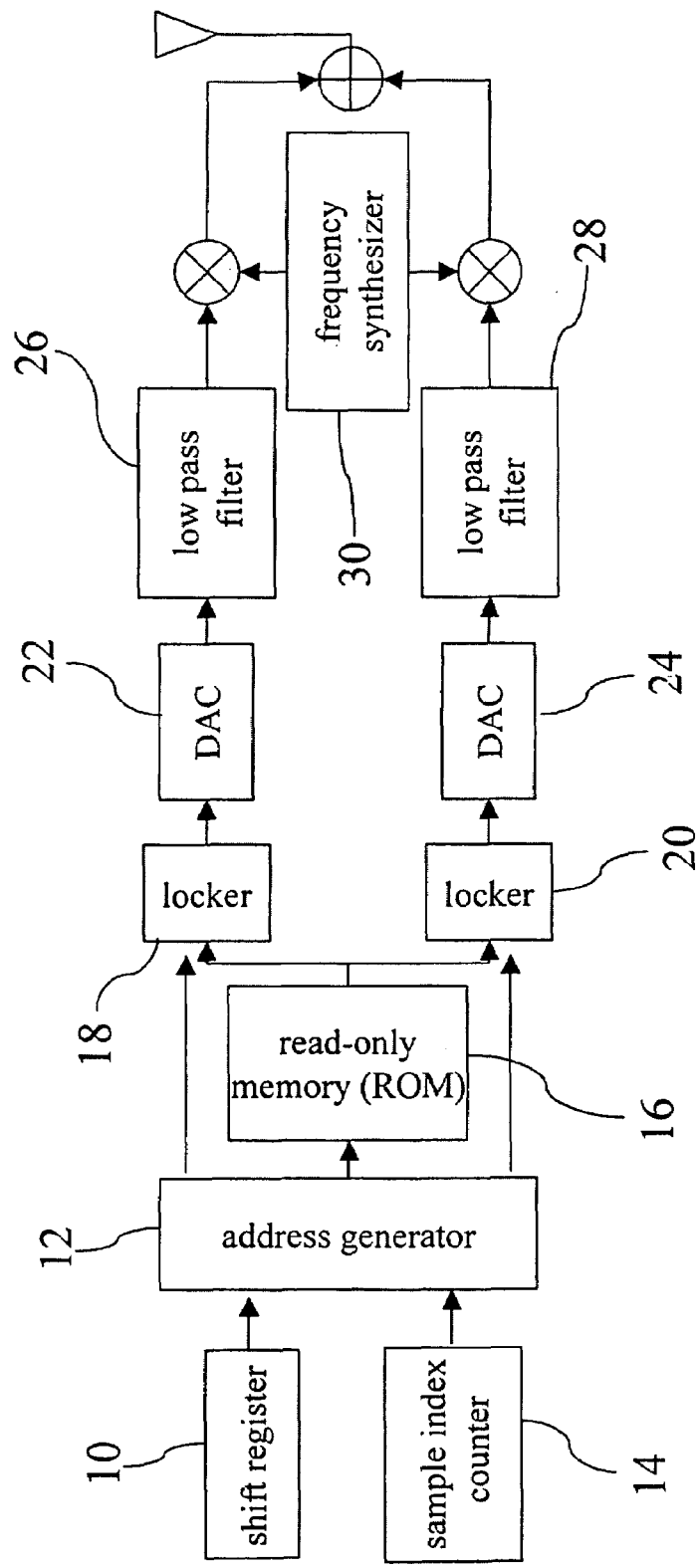
FIG. 1 is a block structure diagram of a conventional transmitter.
Figure 2:
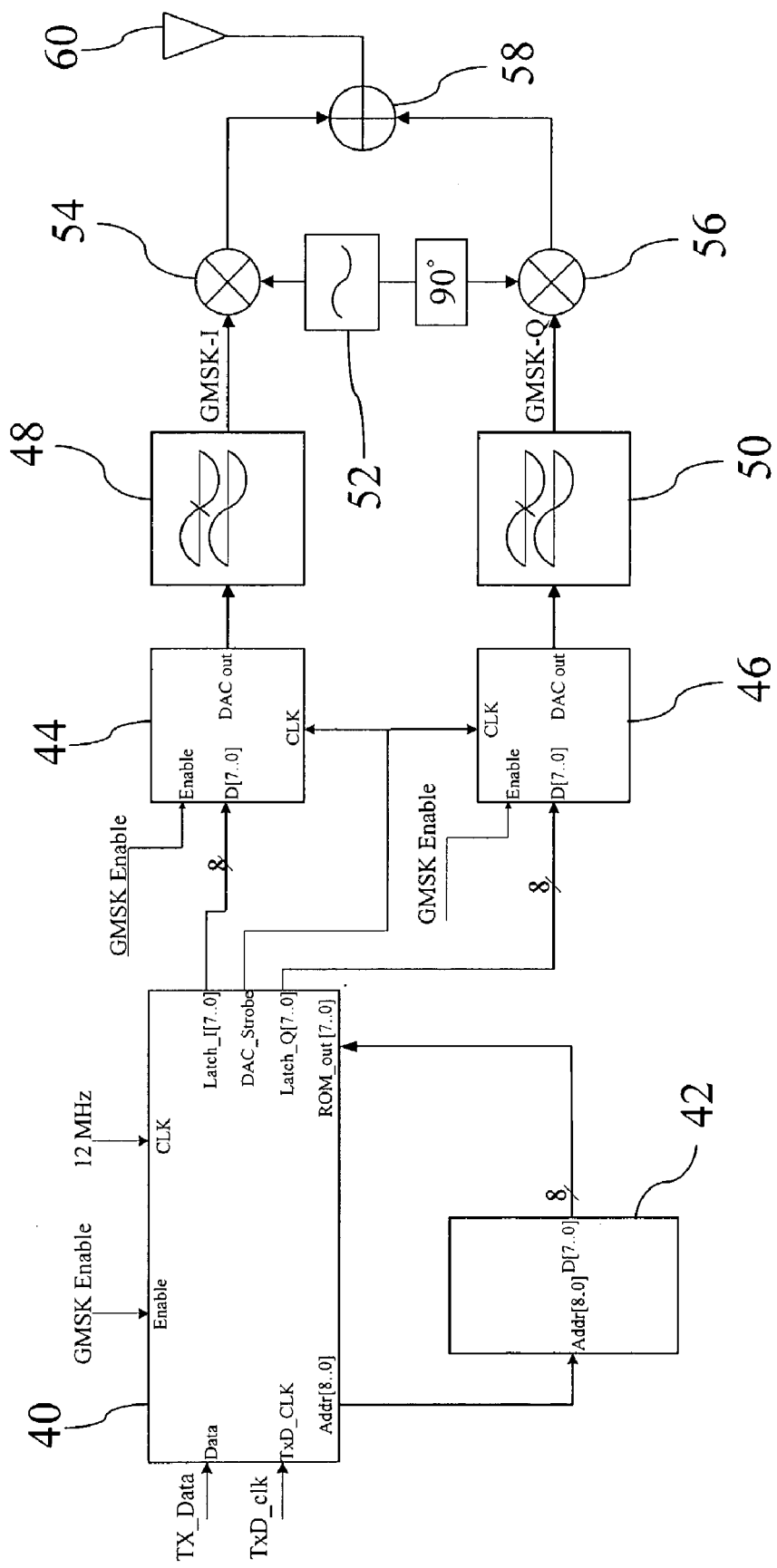
FIG. 2 is a block structure diagram of the present invention.

As shown in FIG. 2, a wireless transmitter modulates a loaded data into an RF signal and then emit out. This wireless transmitter comprises a state machine 40 connected to a ROM 42. A lookup table built in the ROM 42 stores a plurality of IF modulation signals so that the state machine 40 can first determine which waveform signal according a loaded data, look up a corresponding sampling value of the IF modulation signal at the sampling time, temporarily lock and store the sine and cosine sampling values of this signal, and then output a Q signal and an I signal, respectively.

The state machine 40 is connected to two DACs 44 and 46. The state machine 40 outputs the I signal to the DAC 44 for signal conversion to convert this I signal into a cosine analog IF modulation signal, which is filtered by a low pass filter 48. Simultaneously, the state machine 40 also outputs the Q signal to the DAC 46 for signal conversion to convert this Q signal into a sine analog IF modulation signal, which is filtered by a low pass filter 50.

A local oscillator 52 is also provided to generate a local oscillation signal. Two mixers 54 and 56 respectively mix this local oscillation signal with the filtered cosine analog modulation signal and the filtered sine analog modulation signal to modulate these two signals to an emission frequency. Finally, an adder 58 is used to add these two signals to obtain an RF signal, which is emitted out by an antenna

60. The local oscillator 52 is commonly used with the receiver through a time-sharing multiplexing way.

The above state machine 40 further comprises a shift register, which outputs a 3-bit data signal to an address generator according to the loaded data. After the address generator generates a valid address according to index of a sample index counter, a sampling value of a corresponding IF modulation signal is acquired from the lookup table in the ROM. The IF modulation signal is temporarily stored in a locker until a sampling value of another orthogonal IF modulation signal is acquired. The digital IF modulation signal can then be outputted.

In the embodiment shown in FIG. 2, because the IF modulation signals stored in the lookup table of the ROM 42 are complete waveform signals, a larger storage space is required. In consideration of this, the present invention makes use of the symmetrical characteristic of the IF modulation signals. The lookup table of the ROM only stores positive (+) waveforms of the IF modulation signals or negative (−) waveforms of the IF modulation signals, hence saving a half storage space of memory.

Figure 3:
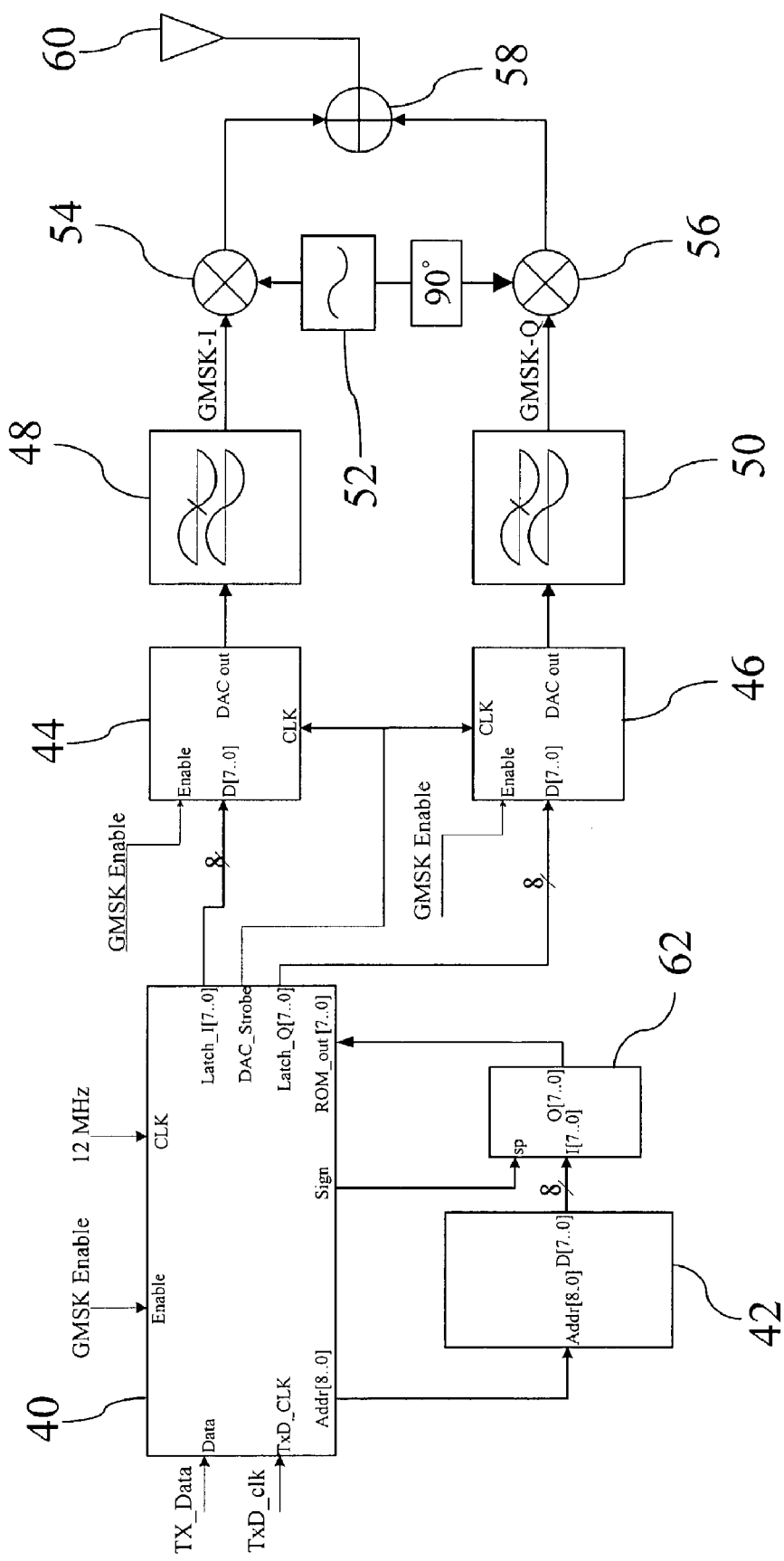
FIG. 3 is a diagram of another embodiment of the present invention.

As shown in FIG. 3, because the lookup table of the ROM only stores positive waveforms of the IF modulation signals or negative waveforms of the IF modulation signals, a sign inverter 62 is connected between the ROM 42 and the state machine 40. The sign inverter 62 determines whether to invert the positive waveform IF modulation signals or the negative waveform IF modulation signals according to the outputted sign decided by the state machine 40. If inversion is required, the sign inverter 62 is used to invert the positive waveform IF modulation signals or the negative waveform IF modulation signals, and then to transmit the processed signals to the state machine 40 for locking and storage. If inversion is not required, the IF modulation signals are directly transmitted to the state machine 40. Except for this part, other structures in FIG. 3 are the same as those disclosed in FIG. 2 and thus will not be further described.

Besides, the IF modulation signals stored in the lookup table of the ROM are obtained by calculating an algorithm. The formulas of this algorithm are as follows.

$$y(t) = \cos\left[(w_{IF} + w_c)t + 2\pi f_m \int_0^t g(\tau)d\tau\right]$$

$$= \cos[(w_{IF} + w_c)t]I(t) - \sin[(w_{IF} + w_c)t]Q(t)$$

$$= [\cos(w_{IF}t)\cos(w_c t) - \sin(w_{IF}t)\sin(w_c t)]I(t) -$$

$$[\sin(w_{IF}t)\cos(w_c t) + \cos(w_{IF}t)\sin(w_c t)]Q(t)$$

$$= [\cos(w_{IF}t)I(t) - \sin(w_{IF}t)Q(t)]\cos(w_c t) -$$

$$[\sin(w_{IF}t)I(t) + \cos(w_{IF}t)Q(t)]\sin(w_c t)$$

$$= I'(t)\cos(w_c t) - Q'(t)\sin(w_c t)$$

where $I'(t)=[\cos(w_{IF}t)I(t)-\sin(w_{IF}t)Q(t)]=\{\cos(w_{IF}t)I(t)+[-\sin(w_{IF}t)Q(t)]\}$ $Q'(t)=[\sin(w_{IF}t)I(t)+\cos(w_{IF}t)Q(t)]$ where $$I(t) = \cos\left[2\pi f_m \int_0^t g(\tau)d\tau\right]$$

$$Q(t) = \sin\left[2\pi f_m \int_0^t g(\tau)d\tau\right]$$

$I(t)^2+Q(t)^2=1$, $I'(t)^2+Q'(t)^2=1$ (Constan $t$ envelope)

wherein $w_{IF}$ is the intermediate frequency, $w_C$ is the carrier frequency, $f_m$ is the peak frequency shift, and g(t) is the filtered pulse data stream.

In this algorithm, the modulated RF signal is first divided into the IF signal plus the carrier signal and the baseband signal to be expanded in trigonometric functions. The sine term and the cosine term of the IF signal plus the carrier signal are then expanded in trigonometric functions. Next, the sine term and the cosine term of the carrier signal are separately arranged, whose coefficients are two orthogonal IF modulation signals, respectively. Finally, the IF modulation signals are sampled and stored in the lookup table of the ROM according to the sampling rate.

To sum up, the present invention proposes a wireless transmitter and a signal modulation and transmission method thereof. Because the ROM stores signals already modulated to the IF, the transmitter can makes use of a time-sharing way to commonly use a local oscillator with a receiver. Complexity of device can thus be simplified to meet the requirement of compactness of wireless products. Moreover, because the complexity of device is simplified and a local oscillator is saved, the cost can be effectively lowered.

Although the present invention has been described with reference to the preferred embodiment thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

We claim:

1. A wireless transmitter for modulating a loaded data to a radio frequency signal and then emitting out, said transmitter comprising:
   a read only memory having a lookup table therein for storing a plurality of intermediate frequency modulation signals;
   a state machine for selecting a corresponding intermediate frequency modulation signal from said lookup table of said read only memory according to said loaded data, locking and storing said intermediate frequency modulation signal, and then outputting a digital intermediate frequency modulation signal, said modulation signal in said lookup table obtained by calculating an algorithm at different frequencies, and said algorithm comprises the steps of:
      dividing a modulated radio frequency signal into an intermediate frequency signal plus a carrier signal and a baseband signal to be expanded in trigonometric functions;
      expanding sine terms and cosine terms of said intermediate frequency signal plus said carrier signal in trigonometric functions;

separately arranging the sine terms and cosine terms of said carrier signal to obtain coefficients respectively being two orthogonal intermediate frequency modulation signals; and sampling and storing said intermediate frequency modulation signals into said lookup table of said read only memory according to the sampling rate;

at least a digital-to-analog converter connected to said state machine, said digital-to-analog converter converting said digital intermediate frequency modulation signal into an analog intermediate frequency modulation signal;

at least a low pass filter for filtering said analog intermediate frequency modulation signal; and a local oscillator for generating a local oscillation signal and modulating said filtered analog intermediate frequency modulation signal to an emission frequency to obtain said radio frequency signal.

2. The wireless transmitter as claimed in claim 1, wherein if said intermediate frequency modulation signals stored in said lookup table of said read only memory are only positive-waveform intermediate frequency modulation signals, a sign inverter connected between said read only memory and said state machine is further provided to determine whether to invert said positive-waveform intermediate frequency modulation signals according to the outputted sign decided by said state machine and to transmit processed intermediate frequency modulation signals to said state machine for locking and storage.

3. The wireless transmitter as claimed in claim 1, wherein if the intermediate frequency modulation signals stored in said lookup table of said read only memory are only negative-waveform intermediate frequency modulation signals, a sign inverter connected between said read only memory and said state machine is further provided to determine whether to convert said negative-waveform intermediate frequency modulation signals according to the outputted sign decided by said state machine and to transmit processed intermediate frequency modulation signals to said state machine for locking and storage.

4. The wireless transmitter as claimed in claim 1, wherein said state machine further comprises a shift register, which outputs a data bit signal to an address generator according to said loaded data, a corresponding intermediate frequency modulation signal is acquired from said lookup table in said ROM and said intermediate frequency modulation signal is stored in a locker after said address generator generates a valid address according to index of a sample index counter, and said digital intermediate frequency modulation signal is then outputted.

5. The wireless transmitter as claimed in claim 1, wherein said digital intermediate frequency modulation signal comprises a sine digital intermediate frequency modulation signal and a cosine digital intermediate frequency modulation signal, said two digital intermediate frequency modulation signals are respectively converted and filtered by two digital-to-analog converters and two low pass filters, and said two signals are combined into said radio frequency signal to be emitted out after respectively modulated by said local oscillator.

6. The wireless transmitter as claimed in claim 1, wherein said local oscillator is a local oscillator together used with a receiver through time-sharing multiplexing way.

* * * * *